United States Patent
Bharti et al.

(10) Patent No.: US 12,336,433 B2
(45) Date of Patent: Jun. 17, 2025

(54) ELECTRONIC CIRCUIT ASSEMBLIES FOR CAPTURING ELECTRICAL ENERGY

(71) Applicant: INTERNATIONAL BUSINESS MACHINES CORPORATION, Armonk, NY (US)

(72) Inventors: Harish Bharti, Pune (IN); Mukundan Sundararajan, Bangalore (IN); Sandeep Sukhija, Rajasthan (IN); Deepak Bajaj, Leicester (GB); Bryan Sacks, Markham (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 719 days.

(21) Appl. No.: 17/512,941

(22) Filed: Oct. 28, 2021

(65) Prior Publication Data
US 2023/0134707 A1    May 4, 2023

(51) Int. Cl.
*H10N 30/30* (2023.01)
*H02N 1/00* (2006.01)
*H10N 30/80* (2023.01)

(52) U.S. Cl.
CPC ............. *H10N 30/30* (2023.02); *H02N 1/002* (2013.01); *H10N 30/802* (2023.02)

(58) Field of Classification Search
CPC ...... H10N 30/30; H10N 30/802; H02N 1/002; H02J 7/0024; H02J 7/345; H02J 50/001
See application file for complete search history.

(56) References Cited

U.S. PATENT DOCUMENTS

| | | |
|---|---|---|
| 9,084,302 B2 | 12/2015 | Chang et al. |
| 10,496,953 B1 | 7/2019 | Hahn et al. |
| 11,205,904 B2 | 12/2021 | Kim |
| 2005/0093620 A1 | 5/2005 | Ho et al. |
| 2012/0176721 A1 | 7/2012 | Gauthier, Jr. et al. |

(Continued)

FOREIGN PATENT DOCUMENTS

| | | | | |
|---|---|---|---|---|
| CN | 210076624 U | * | 2/2020 | ......... A41D 13/0051 |
| KR | 1733277 B1 | * | 5/2017 | ........... H01L 41/047 |

(Continued)

OTHER PUBLICATIONS

English translation of KR-1733277-B1 (Year: 2017).*

(Continued)

*Primary Examiner* — Tulsidas C Patel
*Assistant Examiner* — Joshua Kiel M Rodriguez
(74) *Attorney, Agent, or Firm* — Michael A. Petrocelli, Esq.; Kevin P. Radigan, Esq.; Heslin Rothenberg Farley & Mesiti P.C.

(57) ABSTRACT

Electronic circuit assemblies are provided, with an electronic circuit assembly including a transducer circuit to generate electrical energy based on applied pressure, and a static-electricity capture circuit to capture electrical energy from static-electrical charge. Further, the electronic circuit assembly includes a power management circuit electrically coupled to the transducer circuit and the static-electricity capture circuit to receive, at least in part, the generated electrical energy based on applied pressure at the transducer circuit and the electrical energy from static-electrical charge captured by the static-electricity capture circuit.

20 Claims, 8 Drawing Sheets

(56) References Cited

U.S. PATENT DOCUMENTS

| | | |
|---|---|---|
| 2019/0006857 A1 | 1/2019 | Alzate-Gaviria et al. |
| 2020/0046065 A1 | 2/2020 | Lam et al. |
| 2021/0068499 A1 | 3/2021 | Borrillo et al. |
| 2021/0112913 A1 | 4/2021 | Lam et al. |
| 2022/0294237 A1 | 9/2022 | Takai et al. |

FOREIGN PATENT DOCUMENTS

| | | | |
|---|---|---|---|
| KR | 2060538 B1 * | 12/2019 | ........... H01L 41/047 |
| WO | WO 2016/137124 A1 | 9/2016 | |
| WO | WO 2019/177346 A1 | 9/2019 | |
| WO | WO 2021/029427 A1 | 2/2021 | |
| WO | WO 2021/071436 A1 | 4/2021 | |

OTHER PUBLICATIONS

English translation of KR-2060538-B1 (Year: 2019).*
English translation of CN-210076624-U (Year: 2020).*
Mel et al., "The NIST Definition of Cloud Computing," National Institute of Standards and Technology, Information Technology Laboratory, Special Publication 800-145, Sep. 2011 (pp. 1-7).
IBM Publication, "z/Architecture Principles of Operation," IBM® Publication No. SA22-7832-12, 13th Edition, Sep. 2019 (pp. 1-2000).
Ali, S.F., et al., "Analysis of Energy Harvesters for Highway Bridges", Journal of Intelligent Material Systems and Structures, vol. 22, No. 16, pp. 1929-1938 (Year: 2011).
Carl, "Charge on Battery from Atmospheric Static", The Survival Podcast Forum, posted Aug. 30, 2016, 4 pages (Year: 2016).
International Search Report (ISR) & Written Opinion for PCT/EP2022/078227, dated Feb. 17, 2023 (16 pages) (Year: 2023).

* cited by examiner

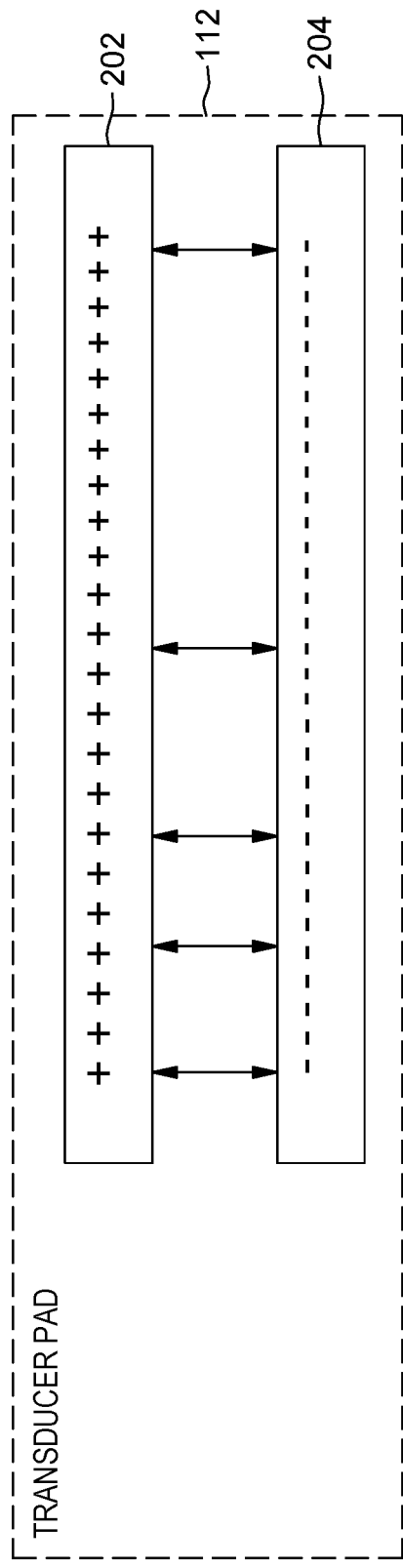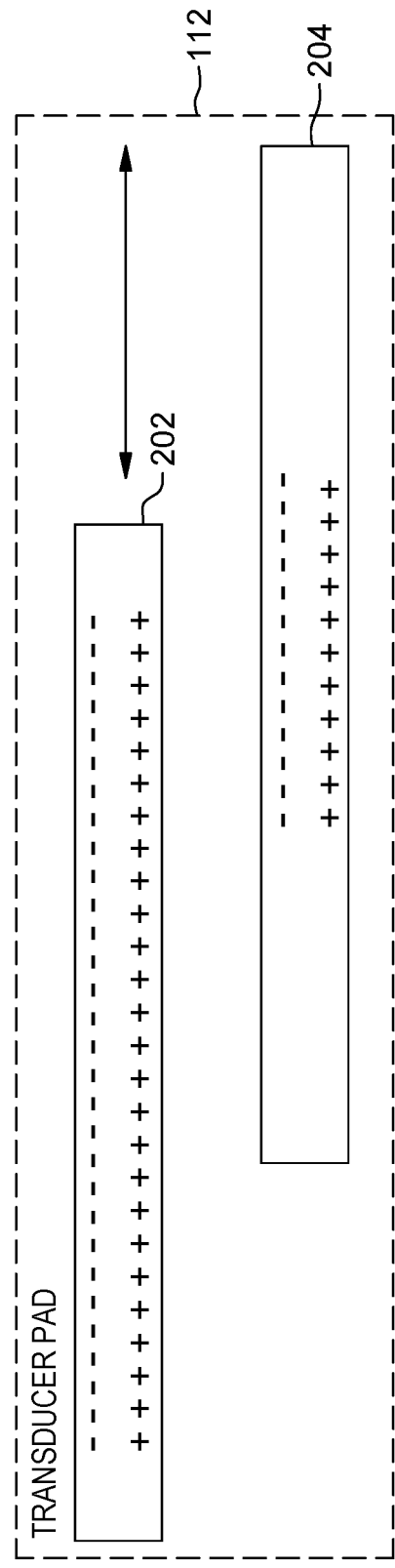

ELECTRONIC CIRCUIT ASSEMBLIES FOR CAPTURING ELECTRICAL ENERGY

BACKGROUND

Alternative energy generation refers to generation of electrical energy other than fossil-fuel-based generation. Rapid deployment of renewable, alternative energy sources and increased energy efficiency technologies are needed to significantly enhance energy security, provide climate change mitigation, and provide economic benefits. Renewable energy sources and energy efficiency are a safe, reliable and affordable approach to enhancing decarbonization of electrical energy generation. To accomplish this goal, energy generation from a variety of alternative, renewable sources continues to be needed.

SUMMARY

Certain shortcomings of the prior art are overcome and additional advantages are provided through the provision, in one or more aspects, of an electronic circuit assembly which includes a transducer circuit to generate electrical energy based on applied pressure, and a static-electricity capture circuit to capture electrical energy from static-electrical charge. Further, the electronic circuit assembly includes a power management circuit electrically coupled to the transducer circuit and the static-electricity capture circuit to receive, at least in part, the generated electrical energy from applied pressure at the transducer circuit, and the electrical energy from static-electrical charge captured by the static-electricity capture circuit.

In another aspect, an electronic circuit assembly is provided which includes a transducer circuit to generate electrical energy based on applied pressure, and a static-electricity capture circuit to capture electrical energy from static-electrical charge. The transducer circuit and the static-electricity capture circuit include a plurality of conductive threads, and the electronic circuit assembly further includes a power management circuit electrically coupled to the transducer circuit and the static-electricity capture circuit to receive, at least in part, the generated electrical energy from the applied pressure at the transducer circuit and the electrical energy from the static-electrical charge captured by the static-electricity capture circuit.

In a further aspect, a method of fabricating an electronic circuit assembly is provided which includes providing a transducer circuit to generate electrical energy based on applied pressure, and providing a static-electricity capture circuit to capture electrical energy from static-electrical charge. Further, the method includes electrically coupling a power management circuit to the transducer circuit and the static-electricity capture circuit. The power management circuit receives, at least in part, the generated electrical energy from the applied pressure at the transducer circuit and the electrical energy from the static-electrical charge captured by the static-electricity capture circuit.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 2A & 2B depict operation of a transducer circuit of an electronic circuit assembly, in accordance with one or more aspects of the present invention;

DETAILED DESCRIPTION

Figure 1:
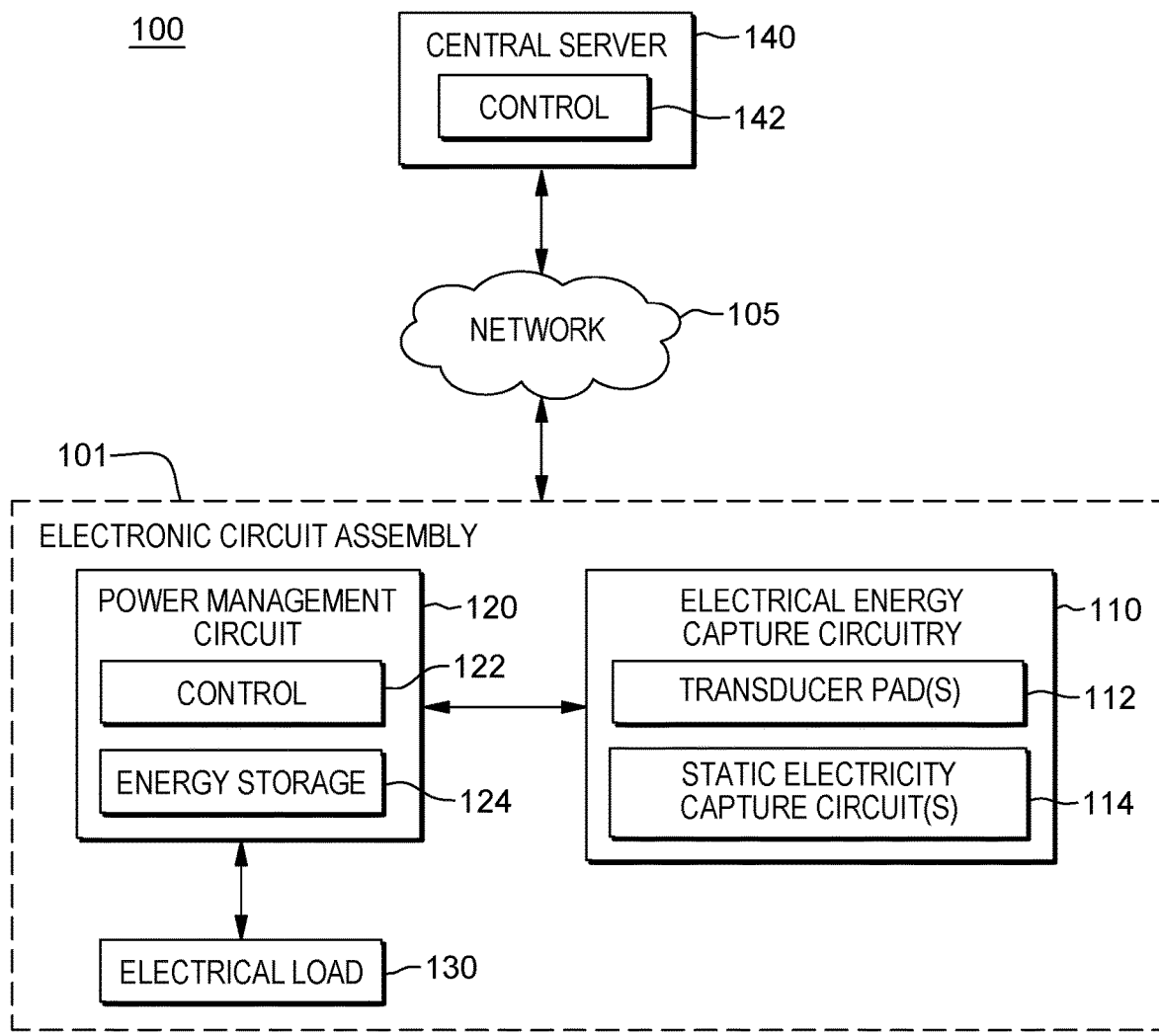
FIG. 1 depicts one embodiment of an energy capture system which includes an electronic circuit assembly, in accordance with one or more aspects of the present invention.

The accompanying figures, in which like reference numerals refer to identical or functionally similar elements throughout the separate views, and which are incorporated in and form a part of the specification, further illustrate the present invention and, together with the detailed description, serve to explain aspects of the present invention. Note in this regard that descriptions of well-known systems, devices, processing techniques, etc., are omitted so as not to obscure the invention in detail. It should be understood, however, that the detailed description and this specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of one or more of the concepts disclosed herein.

Note also that illustrative embodiments are described below using specific systems, circuits, designs, architectures, protocols, layouts, schematics, or tools only as examples, and not by way of limitation. Furthermore, the illustrative embodiments are described in certain instances using particular software, hardware, firmware, tools, or data processing environments only as example for clarity of description. The illustrative embodiments can be used in conjunction with other comparable or similarly purposed systems, applications, or architectures. One or more aspects of an illustrative embodiment can be implemented in hardware, software, or a combination thereof.

As understood by one skilled in the art, the control (i.e., controller or control system) referenced in one or more embodiments described herein can include, for instance, a microcontroller configured to perform at least one or more aspects of the processing described. In one or more implementations, the control processing is integrated within an energy capture system, such as integrated within an electronic circuit assembly of the energy capture system. In one or more other implementations, the control can be implemented remotely from the electronic circuit assembly. For instance, in one or more embodiments, certain aspects of control processing described herein are implemented in a central location within a building or facility. In one or more further embodiments, certain monitoring and control processing aspects disclosed can be implemented remotely, such as in a cloud-based environment, with the electronic circuit assembly being operatively coupled to various monitoring and/or control aspects across one or more networks.

Figure 6:
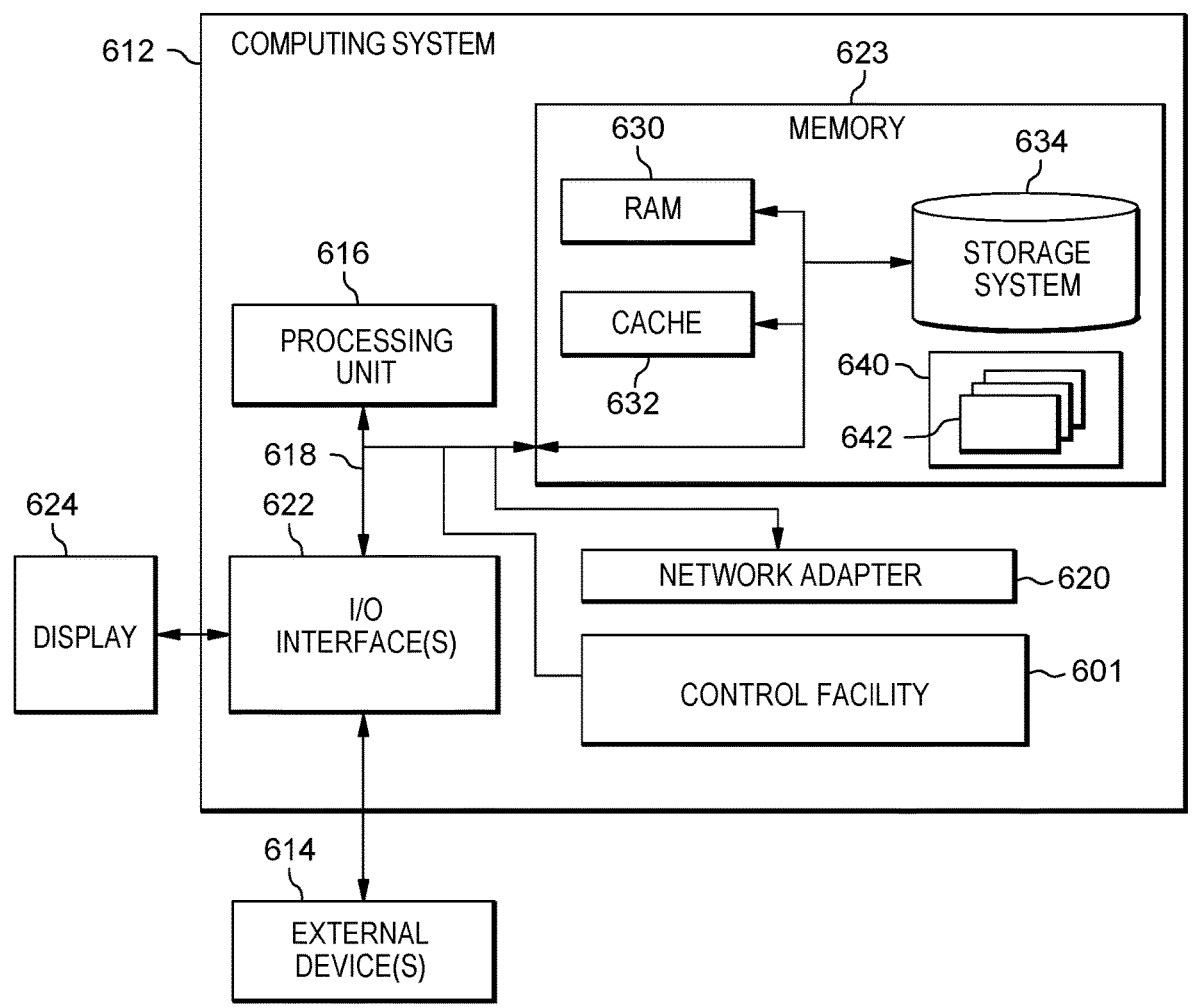
FIG. 6 depicts one embodiment of a computing environment to implement, or facilitate implementing, one or more aspects of control processing, in accordance with one or more embodiments of the present invention.

In certain embodiments, control (and monitoring) processing can be implemented via program code. Program code, as referred to in this application, includes software and/or hardware. For example, program code in certain embodiments of the present invention can include fixed function hardware, but other embodiments can utilize a software-based implementation of the functionality described. Certain embodiments can combine both types of program code, for instance, as firmware. One example of program code, also referred to as one or more programs, is depicted in FIG. 6 as program/utility 640, having a set (at least one) of program modules 642, which can be stored in memory 623 and/or as a control module 601 of a computing system 612. In one or more other implementations, control processing can be implemented (at least in part) in one or more microcontrollers associated with, or provided as part of, an electronic circuit assembly. For instance, in one implementation, an electronic circuit assembly such as disclosed herein can have a microcontroller associated therewith to facilitate performing one or more aspects of the power management control processing described.

As noted, disclosed herein in one or more aspects, is an electronic circuit assembly of an energy capture system, which generates or captures electrical energy as an alternate energy generation system. By way of example, FIG. 1 depicts one embodiment of an energy capture system, generally denoted 100, which includes an electronic circuit assembly 101 configured to capture electrical energy such as described herein. In one or more implementations, electronic circuit assembly 101 can be implemented in a variety of configurations including, for instance, in a floor pad, carpet or tile, as a wall pad, cloth or tile, as a clothing item (such as a glove), or in association with any surface to which pressure and/or static electricity can be applied. In one or more embodiments, the electronic circuit assemblies described herein can be operational assemblies in use at one or more venues or facilities.

As illustrated, in one embodiment, electronic circuit assembly 101 includes electrical energy capture circuitry 110 and a power management circuit 120. Electrical energy capture circuitry 110 includes one or more transducer circuits, such as transducer pad(s) 112, and one or more static-electricity capture circuits 114. Distribution of captured electrical energy is controlled, in one embodiment, by a control 122 associated with power management circuit 120 and, in one implementation, is stored in an energy storage device 124 associated with power management circuit 120 for selective distribution to one or more electrical loads 130, as required.

As depicted in FIG. 1, one or more aspects of control processing (and/or cognitive analytics described herein) can be implemented by control 122 of power management circuit 120 and/or by a control 142 of a remote system, such as a central server 140 in communication with electronic circuit assembly 101 across one or more networks 105. In one or more implementations, central server 140 with control 142 can be a central cognitive server in communication with one or more electronic circuit assemblies of a facility, building, etc., across one or more networks 105, and/or can be, or can utilize, for instance, a cloud-based system. Network(s) 105 can be, for example, a telecommunications network, a local-area network (LAN), a wide-area network (WAN), such as the Internet, or a combination thereof, and can include wired, wireless, fiber-optic connections, etc. Network(s) 105 can include one or more wired and/or wireless networks that are capable of receiving and transmitting data, and control signals, to facilitate processing as described herein.

By way of further example, in one or more embodiments, control 122 of power management circuit 120 and/or control 142 of central server 140 can implement a variety of cognitive engines. One cognitive system is the IBM Watson® system available from International Business Machines Corporation of Armonk, New York, USA. The IBM Watson® system is an application of advanced natural language processing, information retrieval, knowledge representation and reasoning, and machine learning technologies in the field of domain question answering. The IBM Watson® system is built on International Business Machine Corporation's Deep QA' technology used for hypothesis generation, massive evidence gathering, analysis, and scoring. As described herein, cognitive analytic control can be used to facilitate selection of appropriate locations for placement of the electronic circuit assemblies, to evaluate performance of the electronic circuit assemblies, as well as to reevaluate periodically selection of locations for the electronic circuit assemblies to, for instance, optimize electrical energy generation and/or capture.

In one embodiment, the transducer circuit(s) (e.g., transducer pad(s)) 112 of electrical energy capture circuitry 110 can be, or include, one or more variable capacitors or variable capacitor subassemblies configured to convert mechanical energy to electrical potential energy, that is then extracted by the power management circuit. In one or more implementations, the variable capacitors of the transducer circuit(s) can be micro-capacitors (or nano-capacitors) configured to generate power with applied pressure. As noted, in one or more embodiments, the electronic circuit assembly can be used in a variety of products and locations. In one embodiment, the electrical energy capture circuitry 110 of FIG. 1 can be embodied in, for instance, pads, carpets, tiles, or other fixed-location products, or embodied in portable, wearable or implantable devices or structures where, for instance, motion of a body, such as an individual, vehicle, etc., can provide the mechanical energy source.

By way of example, in FIG. 2A, relative movement between variable capacitor plates 202, 204 of a transducer circuit (or pad) together or away can be converted to electrical energy, as can a linear or sliding movement of capacitor plates 202, 204, as illustrated in FIG. 2B. A plurality of variable capacitor subassemblies can be provided, in one embodiment, to capture electrical energy with downward pressure, as well as a linear or sliding pressure, such as the case with a moving vehicle or individual passing over the transducer circuit(s).

Figure 3A:
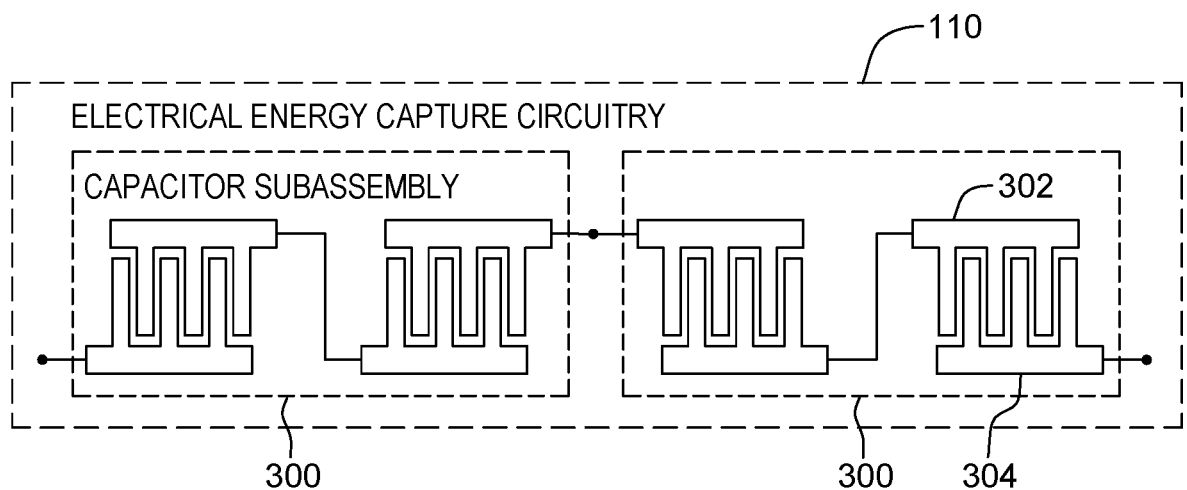
FIG. 3A depicts a schematic embodiment of electrical energy capture circuitry of an electronic circuit assembly, in accordance with one or more aspects of the present invention.

By way of further example, FIG. 3A depicts a further embodiment of a transducer circuit of electrical energy capture circuitry 110, where multiple variable capacitor subassemblies 300 are illustrated, with each capacitor subassembly including one or more variable capacitors formed by opposing capacitor plates 302, 304, spaced with a dielectric between the plates. As illustrated in FIG. 3A, capacitor plates 302, 304 can be interleaved to increase the surface area of the plates in opposition, and in one or more embodiments, comb-like structures can be used, as depicted, for the individual variable capacitors of the subassemblies. In one or more implementations, a large array of variable capacitor subassemblies can be implemented within electrical energy capture circuitry 110, depending on the size or the location to be covered by the electronic circuit assembly. Further, where the variable capacitors are micro-capacitors or nano-capacitors, larger numbers of variable capacitor subassemblies can be provided.

Figure 3B:
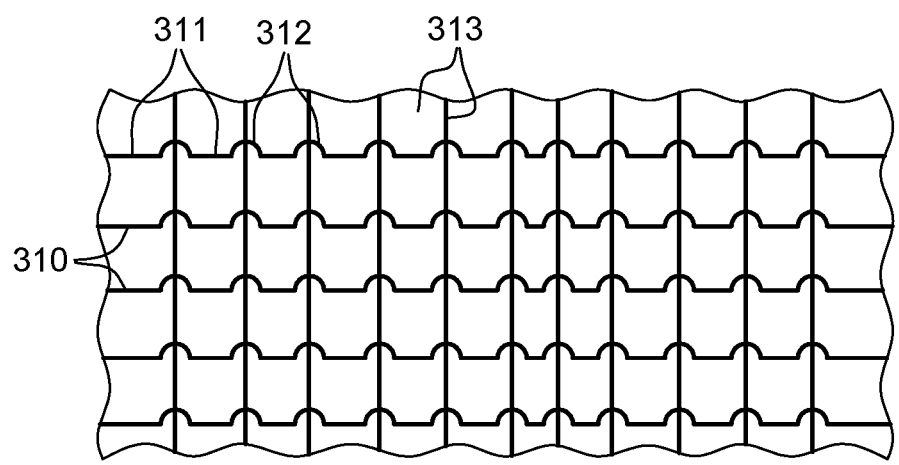
FIG. 3B depicts a further embodiment of electrical energy capture circuitry of an electronic circuit assembly with a plurality of electrically conductive threads, in accordance with one or more aspects of the present invention.

In one or more embodiments, a plurality of conductive elements, such as a plurality of conductive threads, form, at least in part, the electrical energy capture circuitry including, for instance, the variable capacitor subassemblies, and/or the static-electricity capture circuits (or the electrical load powered by the circuit). In FIG. 3B, a portion of an electronic circuit assembly is illustrated with a plurality of conductive threads 310 that include horizontal portions 311 and vertically-extending portions 312, which can be layered and arranged to form, for instance, variable capacitor subassemblies such as depicted in FIG. 3A, and/or one or more aspects of the static-electricity capture circuit(s) (such as a conductive antenna), or of the electrical load (such as resistive threads to be used for heating a space). As shown in FIG. 3B, the conductive threads 310 can be formed on, or in association with, a dielectric material 313, which in one embodiment, can be a flexible dielectric layer, with the electrical energy capture circuitry being formed from a plurality of stacked layers configured to define the desired transducer circuit(s), static-electricity capture circuit(s), and/or electrical load.

In one implementation, conductive threads 310 and dielectric material and/or threads 313 from the capacitor circuit(s) and are displaced with the application of pressure to the circuit(s), which will change the dielectric constant, and the capacitance will change. In one or more further implementations, the captured charge on one or more conductive threads can also originate from static-electrical charge of the individual or object moving over the energy capture system. In one example, static-electricity on a wire antenna (e.g., formed from the conductive threads) can be collected and used to charge the energy storage device. In one circuit implementation, a transformer, such as a 12-volt transformer, an antenna wire, a high-voltage capacitor, and an insulator (such as a spark plug with insulator-type circuit), can be connected together to form the static-electricity capture circuit.

In one or more implementations, the conductive threads discussed herein are used to carry current similarly to conductive wires and are used to create circuits such as described herein. The conductive threads can be stitched or formed together to create flexible circuits that require no soldering. In one or more embodiments, silver-coated, stainless-steel-coated, or copper-coated threads can be used in a variety of different plys. The selection of the particular thread's attributes can depend on the type or size of the energy capture system desired, with the selection of particular conductive threads depending on, for instance, the desired line resistance. In one implementation, Ohms Law can be used to determine thread resistance specific to a particular energy capture system implementation.

In one implementation, the conductive threads can have a non-conductive core, such as a cotton, polyester, nylon, etc., fiber core, that is coated with one or more thin layers of conductive material on the surface of the thread, such as with silver, copper, etc., that will (in part) function to also draw away static-electricity charge, such as from an individual walking over the electronic circuit assembly over a period of seconds, or in smaller amounts, to avoid a sudden shock to the individual. In one implementation, the conductive threads can be configured to extend with vertical portions and horizontal portions in multiple directions, such as depicted in FIG. 3B. In one or more implementations, the conductive threads can be used to define the plates or other conductive circuitry of the transducer circuit and/or the conductive antenna or other conductive lines of the static-electricity capture circuit. In one specific implementation, the transducer circuit and static-electricity capture circuit can be integrated together with, for instance, the vertical portions of the conductive threads facilitating capture of static-electricity, and the horizontal portions being arrayed in multiple layers to define opposing capacitor plates of variable micro-capacitors of the transducer circuit. A variety of implementations are envisioned by the description provided herein.

In one or more further embodiments, the static-electricity capture circuit(s) can be configured with a plurality of conductive threads extending vertically upwards from a surface of the electronic circuit assembly, and more particularly, from a surface of the electrical energy capture circuitry. In one implementation, small vertically-oriented conductive threads extend outwards to capture or discharge static-electrical charge on a body, vehicle, or other structure in contact with the electronic circuit assembly. The captured electrical energy can be stored in the power management circuit, such as in an energy storage device associated therewith. In one example, a typical range of 2000-4000 volts is a threshold value where an individual can feel a static electrical shock, which can depend also on the size of the individual, and other factors. In one implementation, the vertically-extending conductive threads can be electrically interconnected to form an antenna (which can also capture any static charge in the atmosphere) of the static-electricity capture circuit, which can also include (in one embodiment) an appropriate high voltage capacitor, insulators, and a transformer.

Figure 4A:
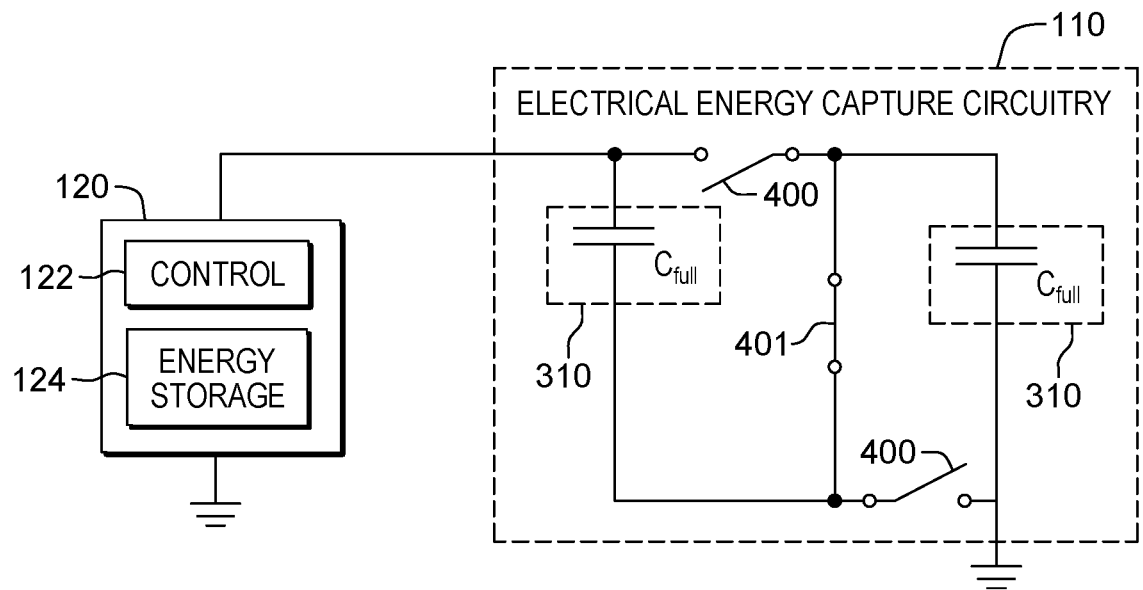
FIGS. 4A & 4B depict one embodiment of operational schematics of electrical energy capture circuitry of an electronic circuit assembly, in accordance with one or more aspects of the present invention.
Figure 4B:
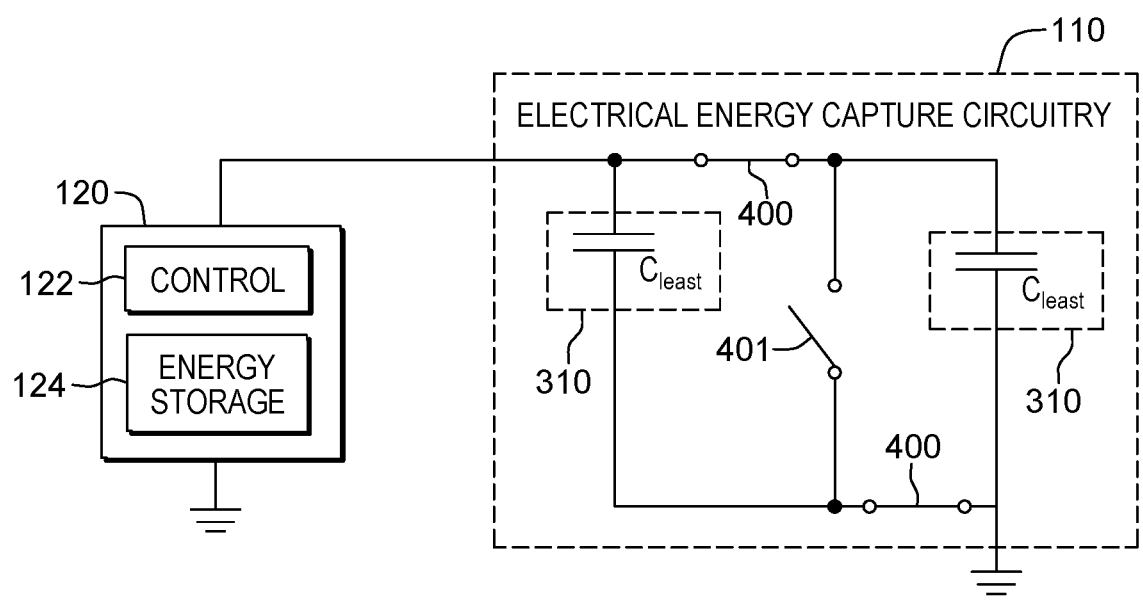

By way of further example, FIGS. 4A & 4B depict one embodiment of operational schematics of electrical energy capture circuitry 110 of an electronic circuit assembly such as depicted in FIG. 1. FIGS. 4A & 4B illustrate how voltage is captured via the variable capacitor subassemblies when series-connected, and then transferred when parallel-connected. Initially, as illustrated in FIG. 4A, the variable capacitor subassemblies are connected in-series by control of one or more switches 400, 401, which allows the variable capacitors to charge to a full voltage level, which is the maximum potential available in the circuit, with the total charge being the summation of the voltage levels across the capacitors.

In FIG. 4B, switches 400, 401 are activated to switch the variable capacitance subassemblies from series-connected to parallel-connected, which results in discharging of voltage to the power management circuit 120 for storage and energy storage 124 (in one embodiment). By switching between series-connected in parallel-connected, the mechanical pressure capacitance generated flows to the power management circuit. In this manner, the tribo-electric effect and/or electro-static effect, are utilized by the electrical energy capture circuitry to capture energy for storage, or other use.

Figure 5:
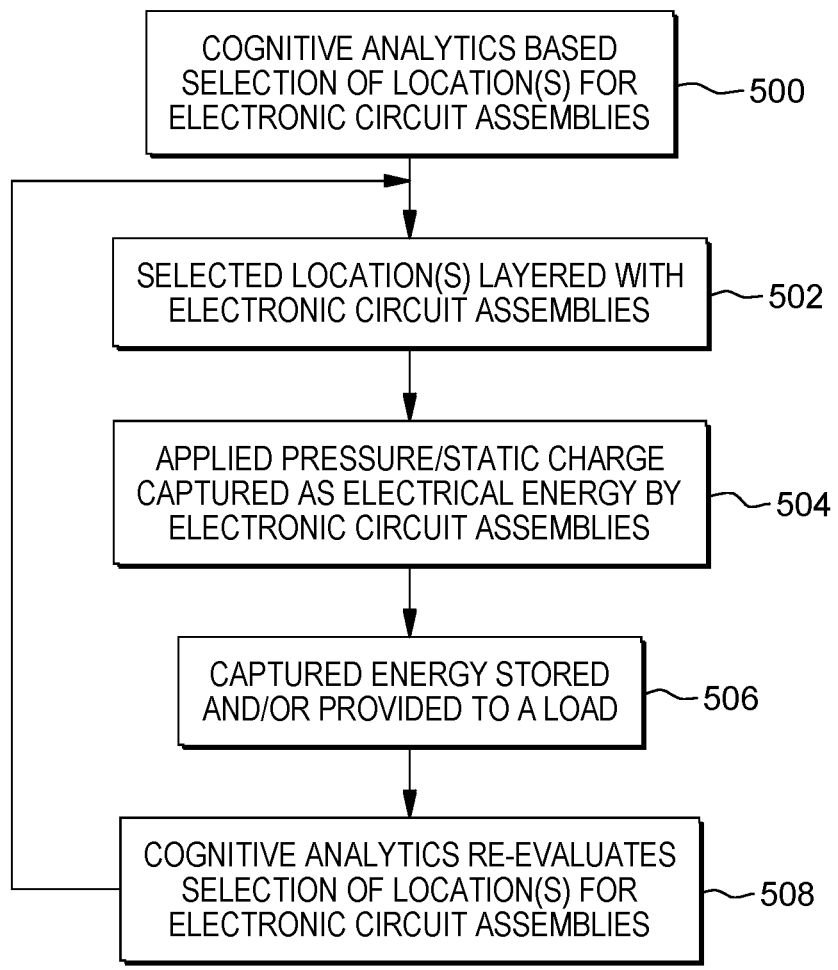
FIG. 5 depicts one embodiment of a workflow illustrating certain aspects of some embodiments of the present invention.

FIG. 5 depicts one embodiment of a workflow illustrating circuit aspects of one or more embodiments of the present invention. Referring to FIG. 5, the control processing includes, in one embodiment, cognitive analytics-based selection of one or more locations for one or more electronic circuit assemblies such as described herein 500. For instance, cognitive analytics can be used to identify high-traffic areas most likely to result in generation of electrical energy via the electronic circuit assembly. As discussed, in one embodiment, the electronic circuit assemblies can be embedded in a floor structure, such as in a building floor, or in a garage or driveway, with the location selected based on physical activities taking place in those areas. The selected location(s) is then layered with one or more electronic circuit assemblies such as described herein 502, and applied pressure and/or static charge is captured in use as electrical energy by the electronic circuit assemblies 504. The captured energy is stored in an energy storage device and/or provided to an electrical load 506. In one embodiment, the electronic circuit assembly can include one or more sensors, such as one or more temperature sensors, as well as energy saving units, which can either result in conversion of energy for storage, or conversion of electrical energy to heat for, for instance, heating a space within which the electronic circuit assemblies are located. In one embodiment, cognitive analytics can reevaluate (e.g., periodically reevaluate) selection of the location for the electronic circuit assemblies 508, and if the selected location should change, then the electronic circuit assemblies can, in one embodiment, be moved to the newly selected locations, in order to account for, for instance, a shift in traffic patterns or other change in the location of the applied pressure and/or static-electrical charge.

Those skilled in the art will note from the above description that provided herein are energy storage systems which include electronic circuit assemblies. The electronic circuit assemblies include one or more transducer circuits to generate electrical energy based on applied pressure, and one or more static-electricity capture circuits to capture electrical energy from static-electrical charge. A power management circuit is provided electrically coupled to the transducer circuit(s) and the static-electricity capture circuit(s) to receive, at least in part, the generated electrical energy from applied pressure at the transducer circuit and the electrical energy from the static-electrical charge captured by the static-electricity capture circuit.

In one implementation, the transducer circuit includes a plurality of variable capacitor subassemblies switchable between series-connected and parallel-connected, where the plurality of variable capacitor subassemblies store greater electrical energy when series-connected, and release, at least in part, electrical energy to the power management circuit when switched to parallel-connected.

In one example, one or more switching devices are provided to control switching of the plurality of variable capacitor subassemblies from series-connected to parallel-connected. The switching device(s) can be controlled by an electrical charge level of the plurality of variable capacitor subassemblies. In another embodiment, the power management circuit includes a controller to control distribution of the generated electrical energy from the applied pressure to the transducer circuit and the captured electrical energy from static-electrical charge. In one embodiment, the controller controls switching of the plurality of variable capacitor subassemblies from series-connected to parallel-connected.

In one or more embodiments, at least one of the transducer circuit, static-electricity capture circuit, or electrical load, include a plurality of conductive elements, where a conductive element of the plurality of conductive elements includes multiple horizontally-extending conductive regions and multiple vertically-extending conductive regions. In one embodiment, the conductive element is a conductive thread. For instance, the conductive thread has a flexible, non-conductive core coated with an electrically-conductive material. In one or more embodiments, the static-electricity capture circuit includes a plurality of vertically-extending conductive elements to facilitate capturing electrical energy from the static-electrical charge. In one embodiment, the captured electrical energy from static-electrical charge is stored by the power management circuit in an energy storage device.

In one or more implementations, a plurality of conductive threads are provided, where the power management circuit directs, at least in part, the received electrical energy to one or more conductive threads of the plurality of conductive threads to produce heat.

In one or more embodiments, the electronic circuit assembly can be configured for the captured static charge to facilitate maintenance of charge on the capacitor plates of the transducer circuit, thereby minimizing the amount of voltage required for the capacitor plates.

In one or more embodiments, the conductive threads can be implemented from a variety of materials. In one embodiment, the materials have properties which can resist wear and tear, are washable, resistance to stress, strain, with a desired Young's Modulus, etc. In one embodiment, the conductive threads have a polymer core that is coated with one or more conductive layers or coatings to define the conductive thread.

Advantageously, the power capture systems described herein utilize the combination of mechanical pressure and static charge to generate electrical energy, which can then be stored, or dynamically used to provide a heating (or cooling) effect. Particles become charged due to the applied pressure, and hence produce electricity. The static charge is produced due to the tribo-electric effect.

In one or more embodiments, micro-sized electrical energy capture circuitry is utilized, manufactured for the particular application or weight load to be experienced.

In one or more implementations, the electrical energy capture circuitry can be disposed in multiple layers of a structure, which includes one or more transducer circuits and one or more static-electricity capture circuits.

In one or more implementations, a fabric of conductive threads can be placed on top of the electrical energy capture circuitry, and be used, for instance, as an electrical load to heat a space using electrical energy generated as described herein.

In one or more implementations, multiple aspects of the electrical energy capture circuitry can be implemented via conductive threads, such as described.

Further exemplary embodiments of a computing environment to implement one or more control aspects of the present invention are described below with reference to FIGS. 6-8.

By way of further example, FIG. 6 depicts one embodiment of a computing environment 600, which includes a computing system 612. Examples of well-known computing systems, environments, and/or configurations that may be suitable for use with computer system 612 include, but are not limited to, a server, a desktop computer, a workstation, a wireless computer, a handheld or laptop computer or device, a mobile phone, a programmable consumer electronic device, a tablet, a personal digital assistant (PDA), and the like.

Computing system 612 can be described in the general context of computer system-executable instructions, such as program modules, being executed by a computer system. Generally, program modules include routines, programs, objects, components, logic, data structures, and so on that perform particular tasks or implement particular abstract data types.

As depicted in FIG. 6, computing system 612, is shown in the form of a general-purpose computing device. The components of computing system 612 can include, but are not limited to, one or more processors or processing units 616, a system memory 623, and a bus 618 that couples various system components including system memory 623 to processor 616.

In one embodiment, processor 616 can be based on the z/Architecture® offered by International Business Machines Corporation, or other architectures offered by International Business Machines Corporation or other companies.

Bus 618 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 612 can include a variety of computer system readable media. Such media may be any available media that is accessible by computing system 612, and it includes both volatile and non-volatile media, removable and non-removable media.

System memory 623 can include computer system readable media in the form of volatile memory, such as random access memory (RAM) 630 and/or cache memory 632. Computing system 612 can further include other removable/non-removable, volatile/non-volatile computer system storage media. By way of example only, storage system 634 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 618 by one or more data media interfaces. As described below, memory 623 can include at least one program product having a set (e.g., at least one) of program modules or code that are configured to carry out the functions of embodiments of the invention.

Program/utility 640, having a set (at least one) of program modules 642, can be stored in memory 632 by way of example, and not limitation, as well as an operating system, one or more application programs, other program modules, and program data. Each of the operating system, one or more application programs, other program modules, and program data or some combination thereof, can include an implementation of a networking environment. Program modules 642 generally carry out the functions and/or methodologies of embodiments of the invention as described herein. Alternatively, a control facility, module, logic, etc., 601 can be provided within computing environment 612, as disclosed herein.

Computing system 612 can also communicate with one or more external devices 614 such as a keyboard, a pointing device, a display 624, etc.; one or more devices that enable a user to interact with computing system 612; and/or any devices (e.g., network card, modem, etc.) that enable computing system 612 to communicate with one or more other computing devices. Such communication can occur via Input/Output (I/O) interfaces 622. Still yet, computing system 612 can communicate with one or more networks such as a local area network (LAN), a general wide area network (WAN), and/or a public network (e.g., the Internet) via network adapter 620. As depicted, network adapter 620 communicates with the other components of computing system, 612, via bus 618. It should be understood that although not shown, other hardware and/or software components could be used in conjunction with computing system 612. Examples, include, but are not limited to: microcode, device drivers, redundant processing units, external disk drive arrays, RAID systems, tape drives, and data archival storage systems, etc.

One or more aspects may relate to or use cloud computing.

It is understood in advance that although this disclosure includes a detailed description on cloud computing, implementation of certain teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

A cloud computing node can include a computer system/server, such as the one depicted in FIG. 6. Computer system/server 612 of FIG. 6 can be practiced in distributed cloud computing environments where tasks are performed by remote processing devices that are linked through a communications network. In a distributed cloud computing environment, program modules may be located in both local and remote computer system storage media including memory storage devices. Computer system/server 612 is capable of being implemented and/or performing any of the functionality set forth hereinabove.

Figure 7:
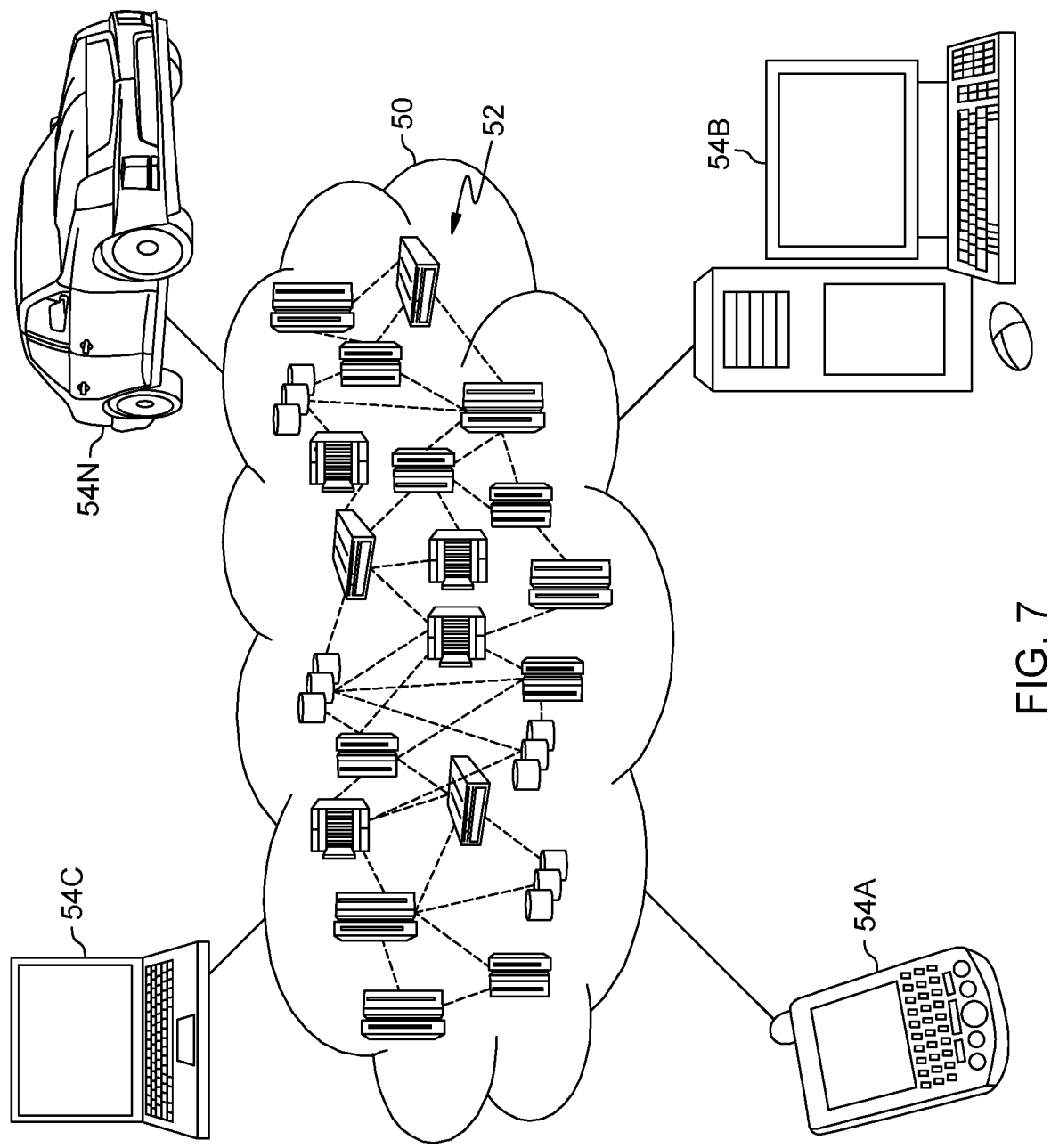
FIG. 7 depicts one embodiment of a cloud computing environment, in accordance with one or more aspects of the present invention.

Referring now to FIG. 7, illustrative cloud computing environment 50 is depicted. As shown, cloud computing environment 50 can comprise one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 52 and cloud computing environment 50 can communicate with any type of computerized device over any type of network and/or network addressable connection (e.g., using a web browser).

Figure 8:
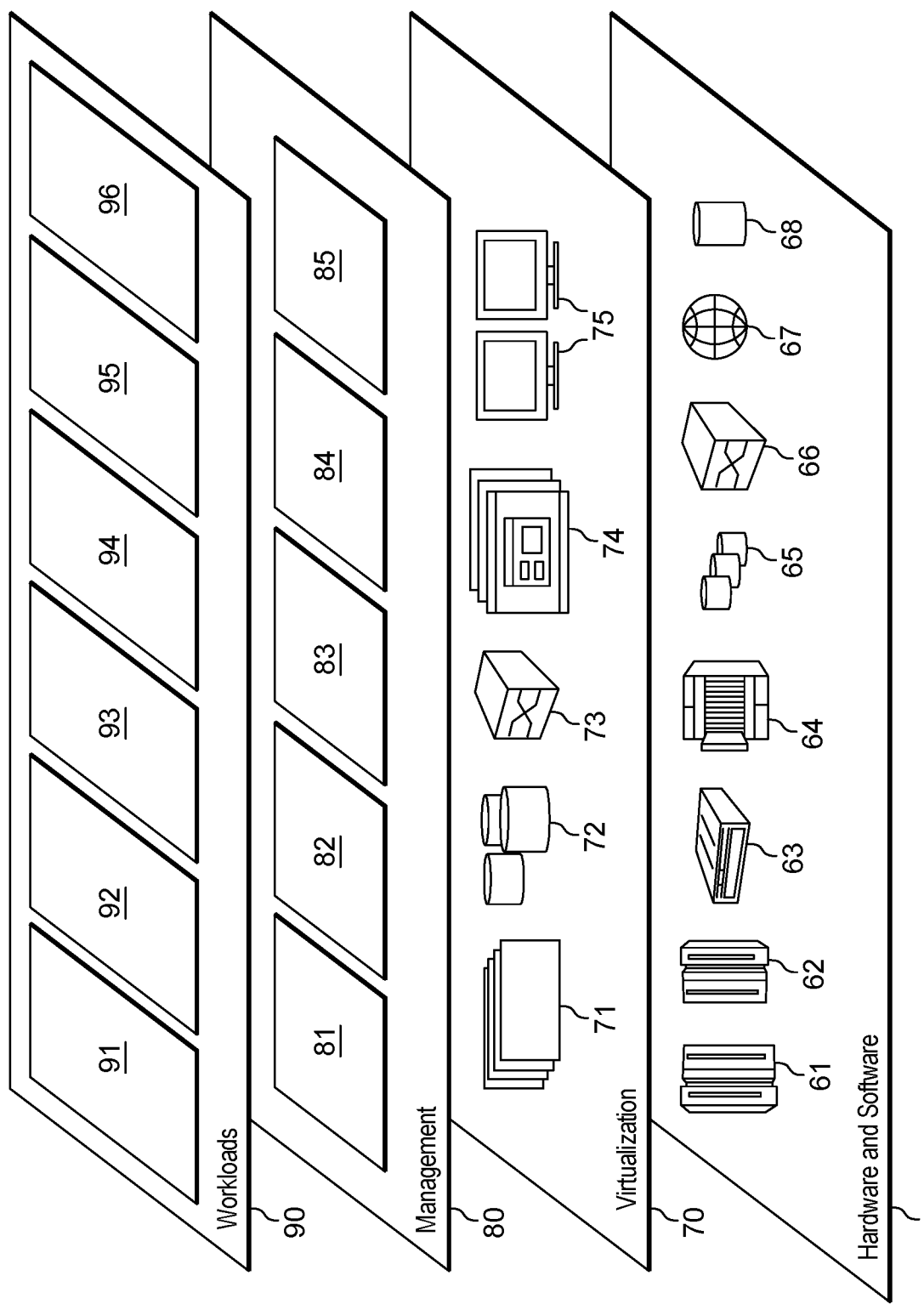
FIG. 8 depict one example of abstraction model layers, in accordance with one or more aspects of the present invention.

Referring to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided.

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91;

software development and lifecycle management 92; virtual classroom education delivery 93; data analytics processing 94; transaction processing 95; and control processing 96.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An electronic circuit assembly comprising:
   electrical energy capture circuitry, the electrical energy capture circuitry comprising:
      a transducer circuit to generate electrical energy based on applied pressure by converting mechanical energy to electrical potential energy; and
      static-electricity capture circuitry comprising a wire antenna to facilitate capture of electrical energy by capturing static-electricity from an external body, the static-electricity capture circuitry being integrated with the transducer circuit; and
   a power management circuit electrically coupled to both the transducer circuit and the static-electricity capture circuitry of the electrical energy capture circuitry to receive, at least in part, the generated electrical energy from applied pressure at the transducer circuit and from the electrical energy from static-electrical charge captured by the static-electricity capture circuitry from the external body.

2. The electronic circuit assembly of claim 1, wherein the transducer circuit comprises a plurality of variable capacitor subassemblies switchable between series-connected and parallel-connected, and wherein the plurality of variable capacitor subassemblies store greater electrical energy when series-connected, and release, at least in part, electrical energy to the power management circuit when switched to parallel-connected.

3. The electronic circuit assembly of claim 2, further comprising one or more switching devices to control switching of the plurality of variable capacitor subassemblies from series-connected to parallel-connected, the switching device(s) being controlled by an electrical charge level of the plurality of variable capacitor subassemblies.

4. The electronic circuit assembly of claim 2, wherein the power management circuit comprises a controller to control distribution of the generated electrical energy from the applied pressure to the transducer circuit and the captured electrical energy from static-electrical charge, the controller controlling switching of the plurality of variable capacitor subassemblies from series-connected to parallel-connected.

5. The electronic circuit assembly of claim 1, wherein the transducer circuit and the static-electricity capture circuitry comprise a plurality of conductive elements, wherein the plurality of conductive elements include multiple horizontally-extending conductive regions and multiple vertically-extending conductive regions.

6. The electronic circuit assembly of claim 5, wherein conductive elements of the plurality of conductive elements comprise conductive threads.

7. The electronic circuit assembly of claim 6, wherein a conductive thread of the plurality of conductive threads comprises a flexible, non-conductive core coated with an electrically conductive material.

8. The electronic circuit assembly of claim 1, wherein the static-electricity capture circuit includes a plurality of vertically-extending conductive elements to facilitate capturing electrical energy from the static-electrical charge and a plurality of horizontally-extending conductive elements to facilitate capturing electrical energy from the applied pressure.

9. The electronic circuit assembly of claim 8, wherein captured electrical energy from static-electrical charge is stored by the power management circuit in an energy storage device.

10. The electronic circuit assembly of claim 1, further comprising a plurality of conductive threads, and wherein the power management circuit directs, at least in part, the received electrical energy to one or more conductive threads of the plurality of conductive threads to produce heat.

11. An electronic circuit assembly comprising:
electrical energy capture circuitry, the electrical energy capture circuitry comprising:
a transducer circuit to generate electrical energy based on applied pressure by converting mechanical energy to electrical potential energy; and
static-electricity capture circuitry comprising a wire antenna to facilitate capture of electrical energy by capturing static-electricity from an external body, the static-electricity capture circuitry being integrated with the transducer circuit;
wherein the transducer circuit and the static-electricity capture circuit comprise a plurality of conductive threads; and
a power management circuit electrically coupled to both the transducer circuit and the static-electricity capture circuitry of the electrical energy capture circuitry to receive, at least in part, the generated electrical energy from the applied pressure at the transducer circuit and from the electrical energy from the static-electrical charge captured from the external body.

12. The electronic circuit assembly of claim 11, wherein a conductive thread of the plurality of conductive threads comprises a flexible, non-conductive core coated with an electrically conductive material.

13. The electronic circuit assembly of claim 11, wherein the transducer circuit comprises a plurality of variable capacitor subassemblies switchable between series-connected and parallel-connected, and wherein the plurality of variable capacitor subassemblies store greater electrical energy when series-connected, and release, at least in part, electrical energy to the power management circuit when switched to parallel-connected.

14. The electronic circuit assembly of claim 13, further comprising one or more switching devices to control switching of the plurality of variable capacitor subassemblies from series-connected to parallel-connected, the switching device(s) being controlled by an electrical charge level of the plurality of variable capacitor subassemblies.

15. The electronic circuit assembly of claim 13, wherein the power management circuit comprises a controller to control distribution of the generated electrical energy from the applied pressure to the transducer circuit and the captured electrical energy from static-electrical charge, the controller controlling switching of the plurality of variable capacitor subassemblies from series-connected to parallel-connected.

16. A method of fabricating an electronic circuit assembly, the method comprising:
providing electrical energy capture circuitry, the electrical energy capture circuitry comprising:
a transducer circuit to generate electrical energy based on applied pressure by converting mechanical energy to electrical potential energy; and
static-electricity capture circuitry comprising a wire antenna to facilitate capture of electrical energy by capturing static-electricity from an external body, the static-electricity capture circuitry being integrated with the transducer circuit; and
electrically coupling a power management circuit to both the transducer circuit and to the static-electricity capture circuit of the electrical energy capture circuitry, the power management circuit to receive, at least in part, the generated electrical energy from the applied pressure at the transducer circuit and the electrical energy from the static-electrical charge captured by the static-electricity capture circuitry from the external body.

17. The method of claim 16, wherein the transducer circuit comprises a plurality of variable capacitor subassemblies switchable between series-connected and parallel-connected, and wherein the plurality of variable capacitor subassemblies store greater electrical energy when series-connected, and release, at least in part, electrical energy to the power management circuit when switched to parallel-connected.

18. The method of claim 17, further comprising one or more switching devices to control switching of the plurality of variable capacitor subassemblies from series-connected to parallel-connected, the switching device(s) being controlled by an electrical charge level of the plurality of variable capacitor subassemblies.

19. The method of claim 17, wherein the transducer circuit and the static-electricity capture circuitry comprise a plurality of conductive elements, wherein the plurality of conductive elements include multiple horizontally-extending conductive regions and multiple vertically-extending conductive regions.

20. The method of claim 19, wherein conductive elements of the plurality of conductive elements comprise conductive threads, and a conductive thread of the plurality of conductive threads comprises a flexible, non-conductive core coated with an electrically conductive material.

* * * * *